United States Patent [19]

Watanabe et al.

[11] Patent Number: 5,203,798
[45] Date of Patent: Apr. 20, 1993

[54] CLEANING APPARATUS FOR SUBSTRATE

[75] Inventors: Masahiro Watanabe; Mitsuyoshi Otake; Megumi Hamano, all of Yokohama, Japan

[73] Assignee: Hitachi, Ltd., Tokyo, Japan

[21] Appl. No.: 720,001

[22] Filed: Jun. 24, 1991

[30] Foreign Application Priority Data

Jun. 25, 1990 [JP] Japan .................. 2-164072

[51] Int. Cl.$^5$ .............................................. B08B 9/10
[52] U.S. Cl. ........................ 134/184; 134/902; 134/151; 134/122 R
[58] Field of Search ............... 18/355; 134/184, 902, 134/198, 173, 151, 122 R, 64 R

[56] References Cited

U.S. PATENT DOCUMENTS

| | | | |
|---|---|---|---|
| 4,082,565 | 4/1978 | Sjolander | 134/184 X |
| 4,475,259 | 10/1984 | Ishii et al. | 134/902 X |
| 4,652,106 | 3/1987 | Jurgensen et al. | 134/902 X |
| 4,728,368 | 3/1988 | Pedziwiatr | 134/184 X |
| 4,806,277 | 2/1989 | Sakurai et al. | 134/184 X |
| 4,854,337 | 8/1989 | Bunkenburg | 134/184 |
| 4,902,350 | 2/1990 | Steck | 134/902 X |
| 5,017,236 | 5/1991 | Moxress et al. | 134/184 |
| 5,038,808 | 8/1991 | Hammond et al. | 134/902 X |
| 5,090,430 | 2/1992 | Nixon | 134/184 |

FOREIGN PATENT DOCUMENTS

| | | | |
|---|---|---|---|
| 344902 | 8/1972 | U.S.S.R. | 134/184 |
| 1431874 | 10/1988 | U.S.S.R. | 134/184 |
| 1385750 | 2/1975 | United Kingdom | 134/184 |

Primary Examiner—Frankie L. Stinson
Attorney, Agent, or Firm—Antonelli, Terry, Stout & Kraus

[57] ABSTRACT

A cleaning apparatus capable of substantially complete removal of contaminations generated during the manufacturing process of glass substrates, semiconductor wafers, magnetic disk substrates, magnetic head substrates or the like. The cleaning apparatus comprises a cleaning bath which is greater in cross section than the material to be cleaned and which has an opening portion for insertion of the material to be cleaned, and an ultrasonic transducer attached to the cleaning bath. The apparatus precludes various defects arising from contaminations, and enhances reliability and yield of the substrates manufactured.

16 Claims, 4 Drawing Sheets $S_1 = b - a$
$S_1 < S_2$

CLEANING APPARATUS FOR SUBSTRATE

BACKGROUND OF THE INVENTION

In recent years, the precision associated with the fabrication of semiconductor and other various electronic devices has been increasing drastically. From the increases in precision, there has arisen the problem that particulate contaminants deposited on substrates, products, etc. during the fabrication processes of electronic devices cause defects in the products, thereby hindering the attempts to enhance the yield of the products. In the fabrication processes, therefore, cleaning techniques for satisfactory and efficient removal of the particulate contaminants deposited on the products are of extreme importance. The present invention relates to a cleaning apparatus for flat substrates, such as semiconductor wafers, glass substrates, magnetic disk substrates, magnetic head substrates, etc. which need high grades of cleaning.

One of the conventional equipments for cleaning of electronic parts and the like is described in *Saishin Kyoryoku Choompa Gijutsu* (*Modern High-Intensity Ultrasonic Technology*), edited by Eiji Mori, published by Extensive Technologies Service Center, Inc. (1987), pp. 223–239, in which an ultrasonic transducer is attached to a bottom or side surface of a cleaning bath. More specifically, this cleaning equipment is an immersion-type ultrasonic cleaning equipment which, as shown in FIG. 7, comprises a cleaning bath 13 filled with a cleaning liquid 15, and an ultrasonic transducer attached to the bottom surface of the bath 13.

Another one of the conventional equipments applies ultrasonic vibration to a thin layer of water formed preliminarily on a substrate by spraying, as disclosed in Japanese Patent Application Laid-Open (KOKAI) No. 54-56255 (1979). As a further one of the conventional cleaning equipments, there is known a water discharge type ultrasonic cleaning equipment as described in Japanese Patent Application Laid-Open (KOKAI) Nos. 48-35671 (1973), 50-60677 (1975) and 63-266831 (1988). In this equipment, as shown in FIG. 8, cleaning water 18 is discharged from a nozzle 16, and an ultrasonic wave generated from an ultrasonic transducer 17 disposed on the back of the nozzle 16 is propagated to the discharged cleaning water 18, thereby effecting cleaning of a material 19 to be cleaned. Yet another cleaning equipment has been known, as disclosed in Japanese Patent Application Laid-Open (KOKAI) No. 60-114386 (1985), in which the material to be cleaned is passed through a cleaning liquid flowing down, and an ultrasonic wave is applied to the material to be cleaned, whereby contaminant particles (hereinafter referred to as "particulate contamination"), oil or other film-form contaminants, metallic salts and the like (all these contaminants will be hereinafter referred to genetically as "contaminants" or "contaminations") are removed from the material to be cleaned.

However, the cleaning equipment comprising an ultrasonic transducer attached to a bottom or side surface of a cleaning bath as shown in FIG. 7 has the problem that the contaminants once removed from the material to be treated into the cleaning liquid will stagnate in the vicinity of the material to be cleaned, since there is little flow of the cleaning liquid. As a result, recontamination of the material to be cleaned occurs under attracting forces such as static electric forces, intermolecular forces, etc. exerted by the material to be cleaned, so that the material cannot be cleaned assuredly.

Also, the cleaning equipment based on the application of an ultrasonic vibration to a thin film of water preliminarily formed on the substrate by spraying is incapable of satisfactory cleaning of the material to be cleaned, because the effect to flow away the contaminants is small, as in the above-mentioned equipment, and the contaminants tend to remain on the material to be cleaned.

In the cleaning equipment based on discharge of water under ultrasonic vibration, as shown in FIG. 8, the cleaning effect is low in other areas than the area in which the discharged cleaning liquid collides against the material to be cleaned. With this equipment, therefore, it is impossible to clean evenly the entire surface of the material to be cleaned, and it is impossible to achieve satisfactory cleaning.

In the conventional cleaning equipment in which the material to be cleaned is passed through a cleaning liquid flowing down and an ultrasonic wave is applied to the material, the flow velocity of the cleaning liquid is so low that the contaminants tend to remain on the material to be cleaned. Accordingly, this type of equipment also fails to accomplish satisfactory cleaning.

SUMMARY OF THE INVENTION

The present invention has been made in order to overcome the above-mentioned problems involved in the prior art.

It is accordingly an object of the present invention to provide a cleaning apparatus by which a material to be cleaned can be cleaned satisfactorily.

In order to attain the above object, according to the present invention, a cleaning apparatus comprises a cleaning bath having a cross section greater than the cross section of a material to be cleaned, the cleaning bath provided with an opening portion for insertion of the material to be cleaned, means for feeding a cleaning liquid under pressure into the cleaning bath through a piping, and an ultrasonic transducer attached to the cleaning bath.

The piping preferably has a cross section greater than the difference between the cross section of the cleaning bath and the cross section of the material to be cleaned.

The ultrasonic transducer may be provided on each of two sides of the cleaning bath.

Furthermore, the cleaning apparatus may be provided with means for feeding the material to be cleaned into the cleaning bath.

DESCRIPTION OF THE PREFERRED EMBODIMENTS

According to the arrangement of the cleaning apparatus of the present invention, a cleaning liquid is fed under pressure into the cleaning bath by the cleaning liquid feeding means, the ultrasonic transducer is operated, and the material to be cleaned is placed in the cleaning bath at the position of the opening portion of the bath, whereby contaminants adhering to the material to be cleaned are removed from the material by ultrasonic vibration and carried away with the cleaning liquid.

The piping, through which to feed the cleaning liquid into the cleaning bath, may be provided with a cross section greater than the difference between the cross section of the cleaning bath and the cross section of the material to be cleaned. This arrangement enables a higher flow velocity of the cleaning liquid in the vicinity of the material to be cleaned which is placed in the cleaning bath.

Further, the ultrasonic transducer may be provided on each of two sides of the cleaning bath, whereby ultrasound can be applied to both sides of the material to be cleaned.

Moreover, the cleaning apparatus may be provided with a means for feeding the material to be cleaned into the cleaning bath, whereby the material can be cleaned automatically.

Based on the above findings, some preferred embodiments of the present invention will now be described below.

Figure 1:
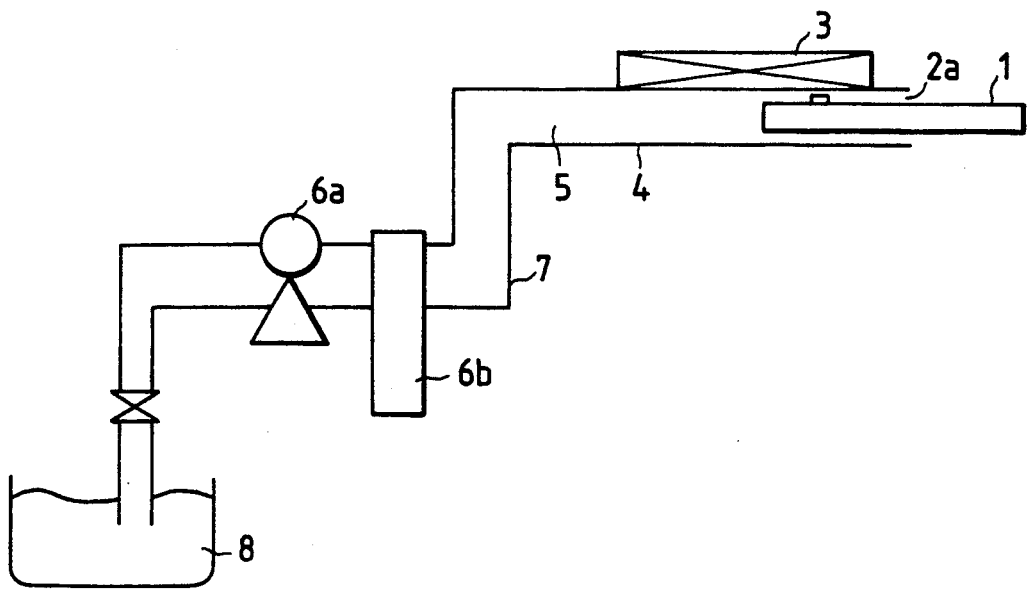
FIG. 1 is a schematic sectional view showing a cleaning apparatus according to the present invention.

FIG. 1 is a schematic sectional view showing a cleaning apparatus according to the present invention. In the figure, there are shown a material to be cleaned 1 and a cleaning bath 4, which has a cross section slightly greater than that of the material to be cleaned 1. The cleaning bath 4 is provided with a first opening portion 2a for insertion of the material to be cleaned 1. A piping 7 is provided for connection between a cleaning liquid tank 8 and the cleaning bath 4. The cross section $S_2$ of the piping 7 is greater than the difference $S_1$ between the cross section b of the cleaning bath 4 and the cross section a of the material to be cleaned 1. Also shown in the figure are a pump 6a disposed in the piping 7, a filter 6b provided in the piping 7 between the pump 6a and the cleaning bath, and an ultrasonic transducer 3 attached to the cleaning bath 4.

In operation, the cleaning liquid 5 such as pure deionized water is compressed to a few kg/cm$^2$ by the pump 6a, and is cleared of particles by the filter 6b. The cleaning liquid 5 is then fed under pressure into the cleaning bath 4, the ultrasonic transducer 3 is operated, and the material to be cleaned 1 is disposed in the cleaning bath 4, whereby contaminations adhering to the material 1 are removed by the ultrasonic vibration and carried away by the cleaning liquid 5. The cleaning liquid 5 discharged through the opening portion 2a is returned to the cleaning liquid tank 8.

Figure 2:
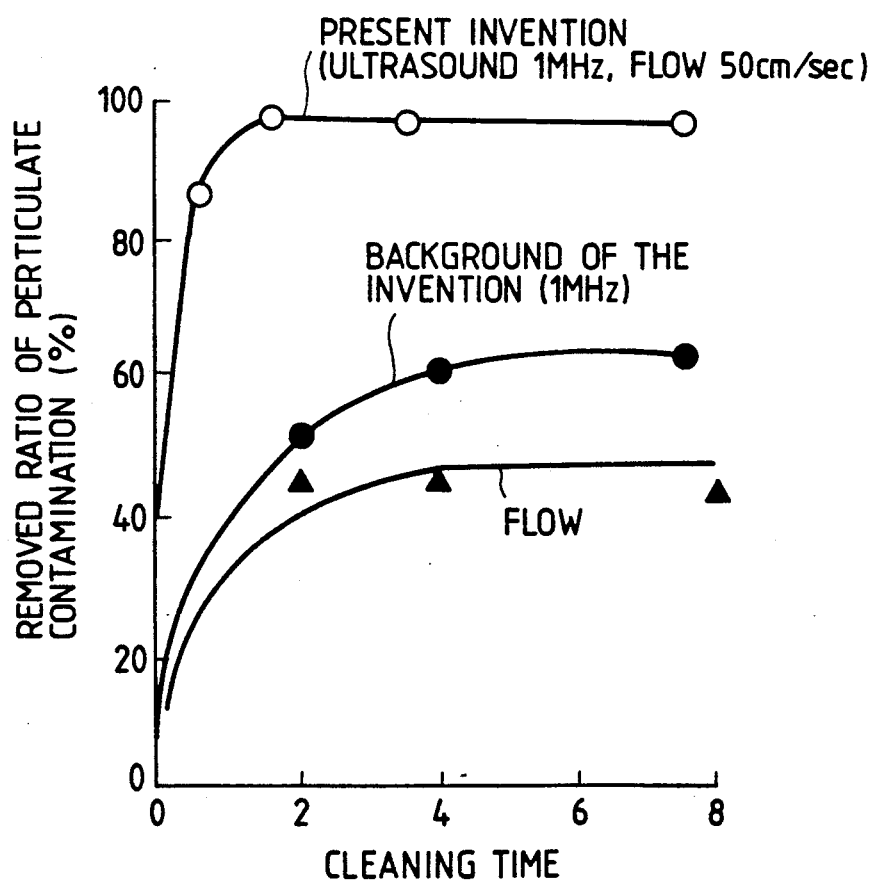
FIG. 2 is a diagram showing the relationship between cleaning time and removed ratio of particulate contamination in the case of cleaning a semiconductor silicon wafer by applying an ultrasonic vibration to the wafer in a flow of a cleaning liquid.
Figure 3:
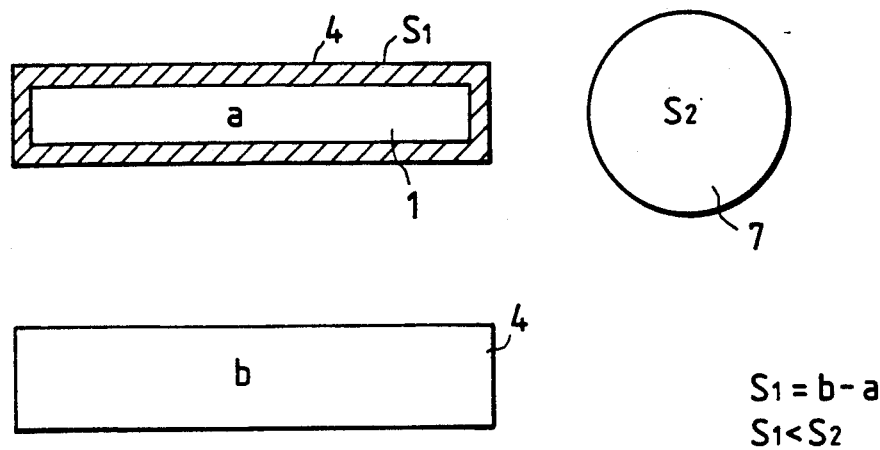
FIG. 3 is an illustration of the relationship between the cross section of the piping and the difference in cross section between the cleaning bath and the material to be cleaned.
Figure 7:
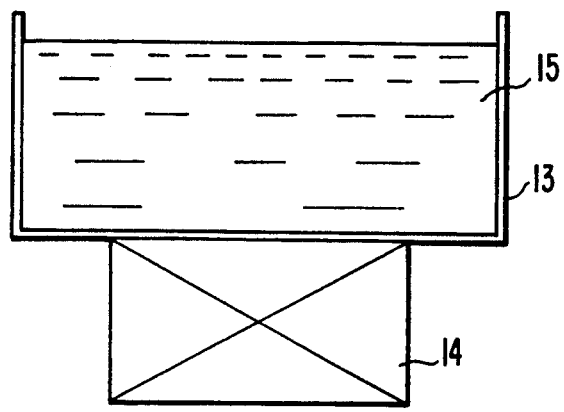
FIG. 7 is a schematic sectional view showing an immersion-type ultrasonic cleaning equipment according to the prior art.
Figure 8:
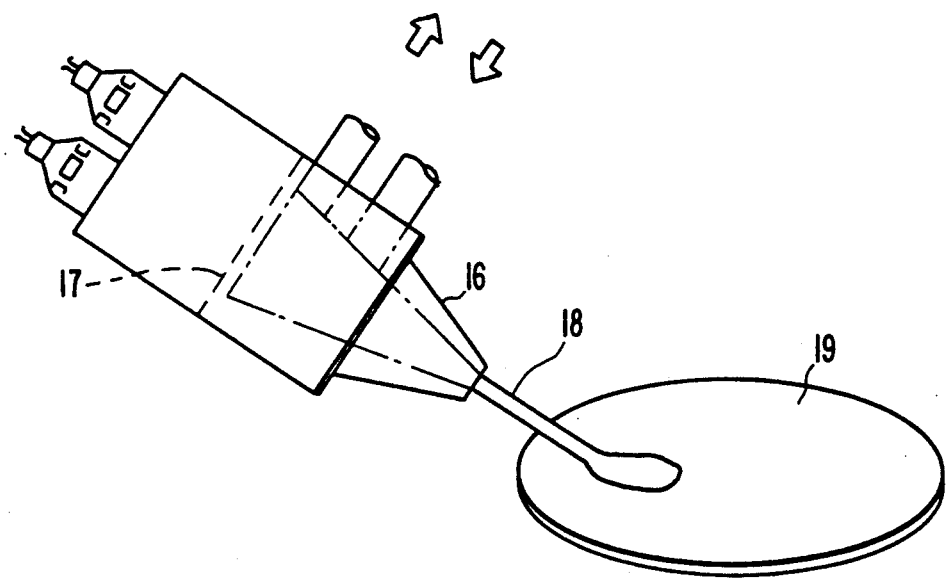
FIG. 8 is a schematic sectional view showing a water discharge type ultrasonic cleaning equipment according to the prior art.

FIG. 2 is a diagram which presents, in comparison, the relationship between cleaning time and removed ratio of particulate contamination during cleaning of a silicon wafer by the cleaning apparatus according to the present invention, the cleaning effect attained according to the prior art as shown in FIG. 7, and the result of cleaning with the aid of liquid flow only, namely, without ultrasonic vibration. As is clearly seen from the diagram, the combination of ultrasonic vibration and liquid flow according to the present invention has an extremely high cleaning effect.

In the cleaning apparatus shown in FIG. 1, therefore, a fast liquid flow is developed throughout the passage for the flat substrate, to flow away the contaminants removed under the function of the ultrasonic transducer 3, so that the material to be cleaned 1 can be cleaned substantially satisfactorily. In addition, because the cross section $S_2$ of the piping 7 is greater than the difference $S_1$ between the cross section b of the cleaning bath 4 and the cross section a of the material to be cleaned 1, the cleaning liquid 5 can acquire a higher flow velocity when flowing in the vicinity of the material to be cleaned 1 disposed in the cleaning bath. The increased flow velocity enables more effective removal of the contaminations and, hence, more satisfactory cleaning of the material to be cleaned 1.

Figure 4:
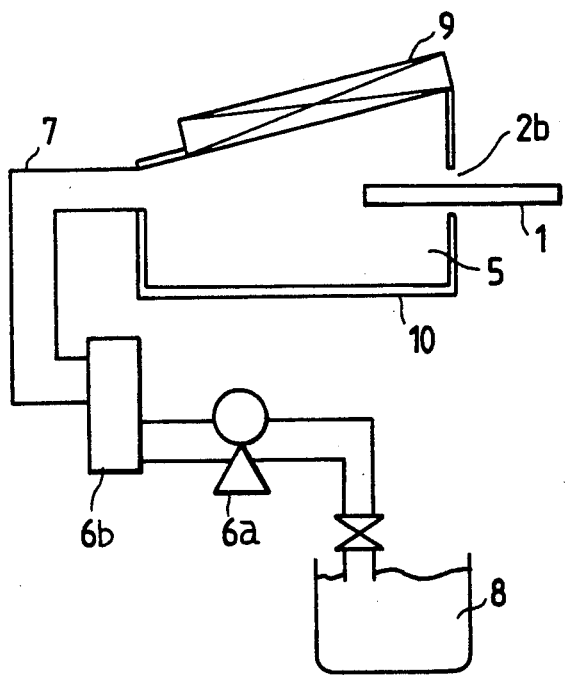
FIGS. 4 and 5 are schematic sectional views respectively showing other cleaning apparatuses according to the invention.

FIG. 4 is a schematic sectional view showing another cleaning apparatus according to the present invention. In the figure, there is shown a second different cleaning bath 10 connected to a piping 7, an upper surface of the bath 10 being inclined. The cleaning bath 10 is provided with an opening portion 2b, the cross section of which is greater than the cross section of the material to be cleaned 1, and the cross section of the piping 7 is greater than the difference between the cross sections of the opening portion 2b and the material to be cleaned 1. An ultrasonic transducer 9 is attached to the upper surface of the cleaning bath 10, and generates ultrasound with a frequency of from 0.5 to 1 MHz or above. The ultrasonic transducer 9 is so disposed that a straight line perpendicular to at least a portion of the plane of attachment of the transducer 9 to the cleaning bath 10 passes through the opening portion 2b.

In this cleaning apparatus, a cleaning liquid 5 supplied from a cleaning liquid tank 8 is compressed to a few kg/cm$^2$ by a pump 6a, and is cleared of particles by a filter 6b. The cleaning liquid 5 is then fed under pressure into the cleaning bath 10, the ultrasonic transducer 9 is operated, and the material to be cleaned 1 is inserted through the opening portion 2b, whereby contaminations adhering to the material to be cleaned 1 are removed by the ultrasonic vibration. The contaminations thus removed from the material to be cleaned 1 are carried away by the cleaning liquid 5 flowing between the opening portion 2b and the material 1. Thus, the cleaning apparatus has an opening portion at a part of the cleaning liquid tank, and a faster flow of the cleaning liquid discharged through the opening portion is utilized for removal of particulate contamination. In this apparatus, furthermore, the ultrasonic transducer is disposed with such an inclination as to permit easier incidence of the ultrasound on the opening portion. This arrangement is suitable for cleaning a portion of the material to be cleaned.

Figure 5:
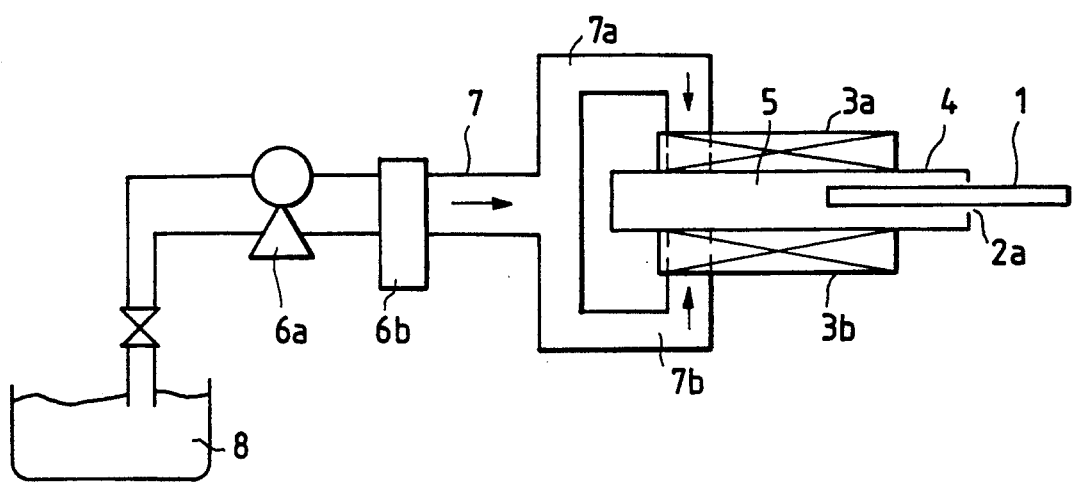

FIG. 5 is a sectional view showing schematically a further cleaning apparatus according to the present invention. In the figure, pipings 7a and 7b branched from a piping 7 are connected respectively to upper and lower surfaces of a cleaning bath 4. First ultrasonic transducers 3a and 3b are attached respectively to the upper and lower surfaces of the cleaning bath 4.

In this cleaning apparatus, with the material to be cleaned 1 placed in the cleaning bath 4, a cleaning liquid 5 is supplied from a cleaning liquid tank 8 through the pipings 7a and 7b to both the upper and lower sides of the material to be cleaned 1, and ultrasound is applied by the ultrasonic transducers 3a and 3b to both sides of the material 1. Accordingly, the material to be cleaned 1 can be cleaned simultaneously on both sides thereof.

Figure 6:
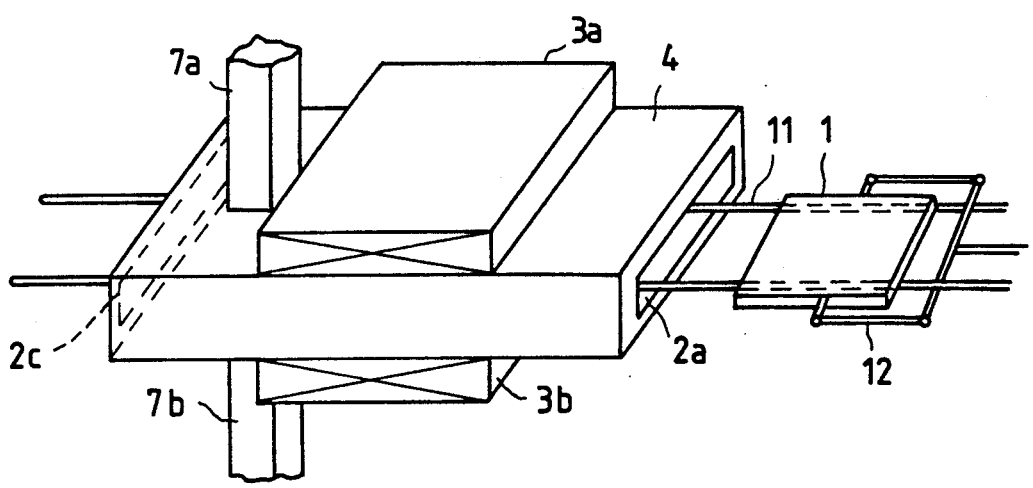
FIG. 6 is a schematic sectional view showing part of a further cleaning apparatus according to the invention.

FIG. 6 is a schematic sectional view which shows part of yet another cleaning apparatus according to the present invention. In the figure, a cleaning bath 4 is provided with an opening portion 2c, at a position opposed to an opening portion 2a. A guide 11 is provided which extends through the openings 2a and 2c. A chuck 12 for holding the material to be cleaned 1 is moved leftward and rightward as viewed in FIG. 6, by a motor or other driving means (not shown). The guide 11, the chuck 12 and the like constitute a means for feeding the material to be cleaned.

In this cleaning apparatus, the material to be cleaned 1 contained in a loader (not shown) disposed in the vicinity of the opening portion 2a is held by the chuck 12, is then moved leftward as viewed in FIG. 6 and is contained in an unloader (not shown) located in the vicinity of the opening portion 2c, whereby the material 1 can be cleaned automatically. Thus, the material to be cleaned 1 can be cleaned easily. Moreover, when a position sensor is provided in the cleaning bath 4 or on the guide 1 and the material to be cleaned 1 is moved by the chuck 12 leftward on FIG. 6 until detected by the position sensor, followed by moving the material 1 rightward on FIG. 6, it is possible to clean only a portion of the material 1.

Although the above embodiments have been described with reference to the use of a pump 6a as a cleaning liquid feeding means, other types of cleaning liquid feeding means may also be used. Further, although a combination of a guide 11, a chuck 12 and the like has been used in the aforementioned embodiment as a means for feeding the material to be cleaned 1, other feeding means may also be used. Moreover, although a single cleaning bath 4 has been connected to the piping 7 in the above embodiments, it is possible to connect a plurality of cleaning baths 4 to the piping 7. In that case, it is preferable that, if two cleaning baths 4 are connected to the piping 7, the relationship $2S_1 < S_2$ be fulfilled.

COMPARATIVE EXAMPLE

Referring now to FIG. 7, there is shown a sectional view of the immersion-type ultrasonic cleaning apparatus described in *Saishin Kyoryoku Choompa Gijutsu* (*Modern High-Intensity Ultrasonic Technology*), edited by Eiji Mori, published by Extensive Technologies Service Center, Inc. (1987), pp. 223-239, as has been mentioned above as an example of the prior art. In FIG. 7 there are shown a cleaning bath 13, an ultrasonic transducer 14, and a cleaning liquid 15. In the immersion-type ultrasonic cleaning equipment in the figure, the cleaning bath 13 is filled with the cleaning liquid 15, and the ultrasonic transducer 14 is attached to the bottom surface of the cleaning bath 13. In this arrangement, therefore, there is little flow of the cleaning liquid 13, and contaminants and particulate contamination which are once removed from the material to be cleaned into the cleaning liquid 15 remain in the vicinity of the material to be cleaned. The contaminants and particulate contamination once removed are then pulled again toward the material to be cleaned, under attracting forces such as statical electric forces, inter molecular forces, etc., resulting in recontamination of the material. Thus, some contaminants and particulate contamination are left on the material to be treated, and it is difficult to achieve satisfactory cleaning. A specific example of data obtained as a result of cleaning by use of an immersion-type ultrasonic cleaning equipment shown in FIG. 7 is presented in the diagram in FIG. 2, which shows the relationship between cleaning time and removed ratio of particulate contamination. It is seen from FIG. 2 that the removed ratio of particulate contamination is much lower when the cleaning equipment of FIG. 7 is used than when the aforementioned cleaning apparatus of the present invention is used.

As has been described above, in the cleaning apparatus according to the present invention, the contaminants adhering to the material to be cleaned are removed from the material by ultrasonic vibration and carried away by the cleaning liquid, whereby the material to be cleaned can be cleaned substantially satisfactorily.

Besides, when the cross section of the piping is made greater than the difference in cross section between the first cleaning bath and the material to be cleaned, it is possible to increase the flow velocity of the cleaning liquid in the vicinity of the material to be cleaned disposed in the cleaning bath, thereby achieving more satisfactory cleaning.

When the ultrasonic transducer is attached to each of two sides of the first cleaning bath, furthermore, it is possible to apply ultrasound to both sides of the material to be cleaned, so that the material can be cleaned simultaneously on both sides thereof.

In addition, when a means for feeding the material to be treated into the first cleaning bath is provided, the material to be cleaned can be cleaned automatically and therefore easily.

Thus, the invention has an extremely high effect.

What is claimed is:

1. A cleaning apparatus comprising a cleaning bath having a cross section greater than the cross section of a material to be cleaned, the cleaning bath provided with an opening portion for insertion of the material to be cleaned, means for feeding a cleaning liquid under pressure into the cleaning bath through a piping, and an ultrasonic transducer attached t the cleaning bath, wherein the piping has a cross section greater than the difference between the cross section of the cleaning bath and the cross section of the material to be cleaned.

2. The cleaning apparatus as set forth in claim 1, wherein the ultrasonic transducer is provided on each of two sides of the cleaning bath.

3. The cleaning apparatus as set forth in 1, further comprising means for feeding the material to be cleaned into the cleaning bath.

4. The cleaning apparatus as set forth in claim 3, wherein the means for feeding the material to be cleaned into the cleaning bath feeds the material through the opening portion for insertion of the material to be cleaned during operation of at least one of the means for feeding the cleaning liquid under pressure into the cleaning bath and the ultrasonic transducer.

5. The cleaning apparatus as set forth in claim 4, wherein the means for feeding the material to be cleaned into the cleaning bath feeds the material to be cleaned through the opening portion in a direction opposite to a flow of the cleaning liquid from the cleaning bath.

6. The cleaning apparatus according to claim 5, wherein the means for feeding the material to be cleaned into the cleaning bath further includes means for withdrawing the material to be cleaned from the cleaning bath.

7. The cleaning apparatus as set forth in claim 6, wherein the means for feeding the cleaning liquid under pressure into the cleaning bath is disposed so as to feed the cleaning liquid into the cleaning bath in a direction transverse to the direction of feeding of the material to be cleaned into the cleaning bath by the means for feeding the material.

8. The cleaning apparatus as set forth in claim 7, wherein the cleaning bath is provided with another opening portion for withdrawal of the material from the cleaning bath by the means for withdrawing.

9. A cleaning apparatus for cleaning a material, comprising a tank for containing a cleaning liquid and including an opening portion for insertion of the material to be cleaned, means including a pump for feeding the cleaning liquid under pressure through a piping and to the tank so as to apply the cleaning liquid under pressure to at least one surface of the material to be cleaned, and at least one ultrasonic transducer attached to the tank, wherein the tank has a cross-section greater than the cross-section of the material to be cleaned and the piping has a cross-section greater than the difference between the cross-section of the tank and the cross-section of the material to be cleaned so as to enable an increased flow velocity of the cleaning liquid in the proximity of the material to be cleaned and an improved cleaning thereof.

10. The cleaning apparatus as set forth in claim 9, wherein the means for feeding the cleaning liquid under pressure through the piping enables application of the liquid under pressure to more than one surface of the material to be cleaned.

11. The cleaning apparatus as set forth in claim 9, wherein a plurality of ultrasonic transducers are provided, at least respective ultrasonic transducers being provided on opposing sides of the tank.

12. The cleaning apparatus as set forth in claim 9, wherein the at least one ultrasonic transducer is arranged on the tank so as to have a predetermined angular relation other than 90° and 180° with respect to the opening portion of the cleaning tank.

13. The cleaning apparatus as set forth in claim 9, further comprising material feeding means for feeding the material to be cleaned into the cleaning tank through the opening portion for insertion of the material to be cleaned in a direction opposite to a flow of the cleaning liquid from the cleaning tank.

14. The cleaning apparatus as set forth in claim 13, wherein the material feeding means for feeding the material to be cleaned into the tank further includes withdrawing means for withdrawing the material from the tank after cleaning of the material.

15. The cleaning apparatus as set forth in claim 14, wherein the means for feeding the material to be cleaned into the tank feeds the material to be cleaned during operation of at least one of the means for feeding the cleaning liquid under pressure to the tank and the at least one ultrasonic transducer.

16. The cleaning apparatus as set forth in claim 15, wherein the tank includes another opening portion for withdrawal of the material from the tank by the withdrawing means.

* * * * *